United States Patent
Zhang et al.

(10) Patent No.: US 10,067,827 B2
(45) Date of Patent: Sep. 4, 2018

(54) ERROR CORRECTION CODE EVENT DETECTION

(71) Applicant: Micron Technology, Inc., Boise, ID (US)

(72) Inventors: Yihua Zhang, Folsom, CA (US); Paolo E. Mangalindan, Rancho Cordova, CA (US); Jianfei Lei, Folsom, CA (US); Andrew D. Proescholdt, Rancho Cordova, CA (US); Gerard A. Kreifels, El Dorado Hills, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 140 days.

(21) Appl. No.: 15/197,446

(22) Filed: Jun. 29, 2016

(65) Prior Publication Data
US 2018/0004596 A1    Jan. 4, 2018

(51) Int. Cl.
*G11C 29/00* (2006.01)
*G06F 11/10* (2006.01)
*G11C 29/50* (2006.01)
*G11C 29/52* (2006.01)
*G11C 29/04* (2006.01)

(52) U.S. Cl.
CPC ...... *G06F 11/1068* (2013.01); *G06F 11/1048* (2013.01); *G11C 29/50* (2013.01); *G11C 29/52* (2013.01); *G11C 2029/0411* (2013.01); *G11C 2029/5004* (2013.01); *G11C 2029/5006* (2013.01)

(58) Field of Classification Search
CPC .. G06F 11/1068; G06F 11/1048; G11C 29/50; G11C 29/52; G11C 2029/0411; G11C 2029/5006; G11C 2029/5004
See application file for complete search history.

(56) References Cited

U.S. PATENT DOCUMENTS

| | | | |
|---|---|---|---|
| 8,448,042 B2 | 5/2013 | Spraul | |
| 8,751,900 B2 | 6/2014 | Kim et al. | |
| 9,318,220 B2 | 4/2016 | Shen et al. | |
| 9,442,787 B2 | 9/2016 | D'Abreu | |
| 2014/0233314 A1* | 8/2014 | Shen | G06F 11/1048 365/185.09 |
| 2015/0363248 A1* | 12/2015 | D'Abreu | G06F 11/076 714/37 |

FOREIGN PATENT DOCUMENTS

WO    2009102100 A1    8/2009

OTHER PUBLICATIONS

ISA/KR, International Search Report and Written Opinion of the International Searching Authority, Int'l Appl. No. PCT/US2017/036194, dated Sep. 20, 2017, Korean Intellectual Property Office, Seo-gu, Daejon, Republic of Korea, 13 pages.

* cited by examiner

*Primary Examiner* — Guy Lamarre
(74) *Attorney, Agent, or Firm* — Holland & Hart LLP

(57) ABSTRACT

Methods, systems, and devices for operating a memory cell or cells are described. An error in stored data may be detected by an error correction code (ECC) operation during sensing of the memory cells used to store the data. The error may be indicated in hardware by generating a measurable signal on an output node. For example, the voltage at the output node may be changed from a first value to a second value. A device monitoring the output node may determine an error has occurred for a set of data based at least in part on the change in the signal at the output node.

22 Claims, 9 Drawing Sheets

NMOS

ERROR CORRECTION CODE EVENT DETECTION

BACKGROUND

The following relates generally to memory devices and more specifically to error correction code (ECC) event detection.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., NOR flash memory and NAND flash memory) can store data for extended periods of time even in the absence of an external power source. Volatile memory devices, e.g., DRAM, may lose their stored state over time unless they are periodically refreshed by an external power source. Certain features of volatile memory may offer performance advantages, such as faster read or write speeds, while features of non-volatile memory, such as the ability to store data without periodic refreshing, may be advantageous.

Systems and devices that require robust data storage may use a highly reliable flash memory type, such as NOR flash memory. Although NOR flash memory is highly reliable, there may be some cases in which an error occurs. A device relying on the NOR flash memory may be unaware of the error and may treat the data as if it is error-free, which may adversely affect the operations of the device.

BRIEF DESCRIPTION OF THE DRAWINGS

The disclosure herein refers to and includes the following figures.

DETAILED DESCRIPTION

An error in NOR flash memory may be detected and indicated to a device via a hardware interrupt. The error may be detected using an error correction code (ECC). Upon detection of the error, a measurable signal may be sent to an interrupt node. The signal may notify the device using the NOR flash memory that an error has occurred.

Memory cells, including NOR memory cells, within a memory array may be used to store data and information. Each NOR memory cell may be used to store one bit of data, for example, which may be represented by the state of the memory cell. For instance, a first state of a memory cell may represent a first binary value (e.g., a logic 0) and a second state of the memory cell may represent a second binary value (e.g., a logic 1). To increase speed, memory cells may be written to, and read from, in sets. When a set of data is written to a set of memory cells, an ECC may be used so that errors are detectable when the memory cell is read. If an error is detected using ECC during a read operation, the error may be flagged in hardware by sending a signal to an interrupt node. For example, the voltage of an interrupt node may be changed to indicate the error to the device, or to another component of the device. A device may learn of an error (e.g., by identifying a signal or measuring a voltage of the interrupt node) and adjust operations accordingly.

Features of the disclosure introduced above are further described below in the context of a memory component. Specific examples are then described for ECC event detection. These and other features of the disclosure are further illustrated by and described with reference to apparatus diagrams, system diagrams, and flowcharts that relate to the notification of errors in NOR memory.

Figure 1:
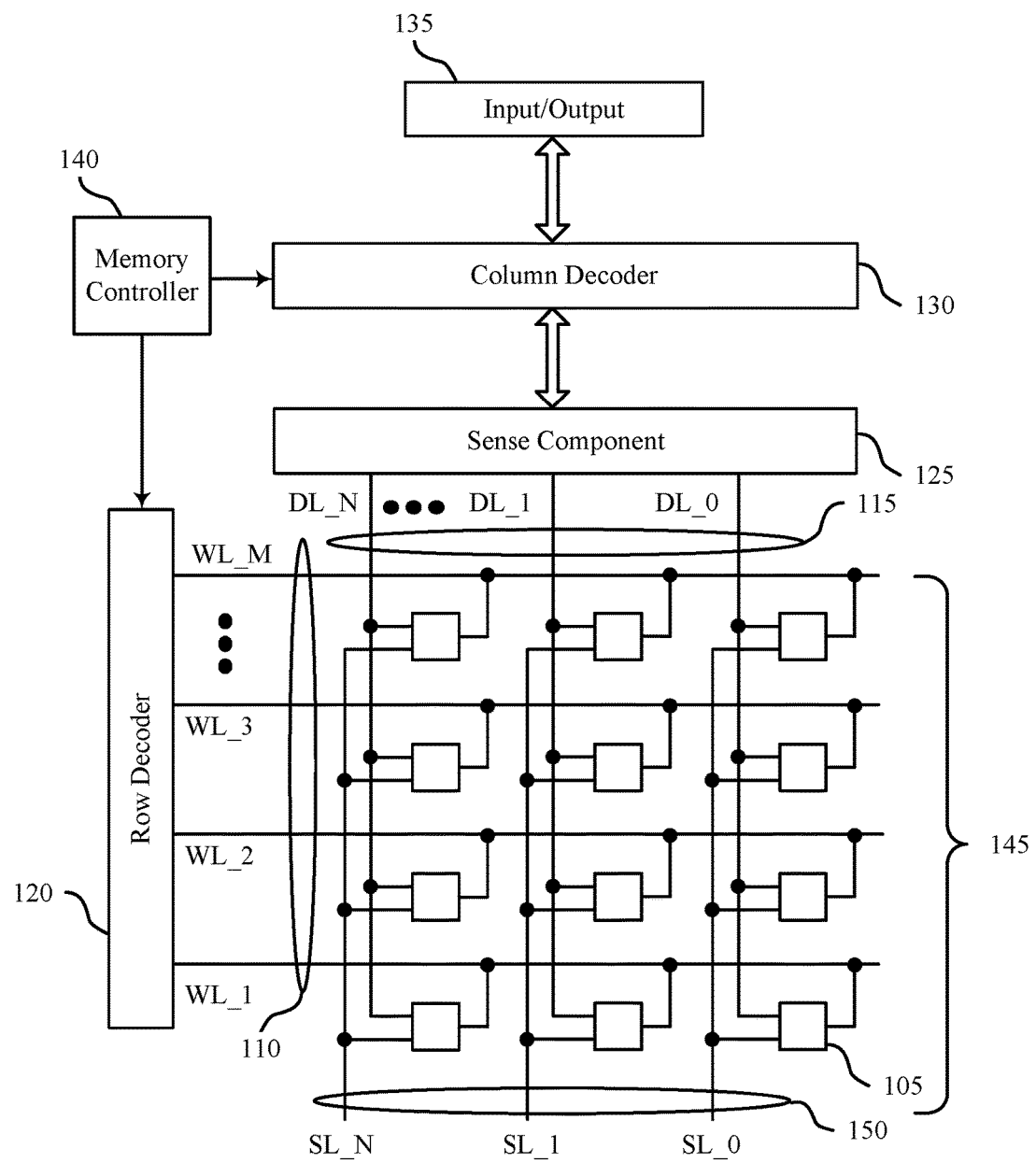
FIG. 1 illustrates an example memory component that supports error correction code (ECC) event detection in accordance with various embodiments of the present disclosure.

FIG. 1 illustrates an example memory component 100 that supports ECC event detection in accordance with various embodiments of the present disclosure. Memory component 100 may also be referred to as an electronic memory apparatus. Memory component 100 includes memory array 145, which includes rows and columns of memory cells 105 that are programmable to store different states. Each memory cell 105 may be programmable to store two states, denoted as a logic 0 and a logic 1 (e.g., the memory cells 105 may be single level cells (SLCs)). That is, each memory cell 105 may store a bit of information. In some cases, a memory cell 105 is configured to store more than two logic states (e.g., the memory cells 105 may be multi-level cells (MLCs)). A memory cell 105 may include a floating gate transistor (e.g., a MOSFET) to store a charge representative of the programmable states; for example, a charged and uncharged floating gate transistor may represent two logic states, respectively. NOR flash memory architectures may commonly use such a design. Different levels of charge on a floating gate transistor may represent different logic states.

In other cases, a memory cell 105 may include a charge trap transistor to store charge in a gate dielectric to represent one or more programmable states.

Source lines 150 may be connected to a common voltage (e.g., common ground or 0 V). Digit lines 115, which may also be referred to as bit lines, may serve as data buses for access operations (e.g., read operations) of memory cells 105. Operations such as reading and writing (e.g., programming and erasing) may be performed on memory cells 105 by activating or selecting the appropriate word line 110, which may also be referred to as an access line, and digit line 115. Activating or selecting a word line 110 or digit line 115 may include applying a biasing voltage to the respective line. Thus, the voltage combination applied to the word line 110 and digit line 115 of a memory cells 105 may define the access operation (e.g., whether it is read or write (erase or program) operation).

Word lines 110, source lines 150, and digit lines 115 are made of conductive materials. For example, word lines 110, source lines 150, and digit lines 115 may be made of metals (such as copper, aluminum, gold, tungsten, etc.), metal alloys, other conductive materials, or the like. According to the example of FIG. 1, each row of memory cells 105 in memory array 145 is connected to a single word line 110, and each column of memory cells 105 is connected to a single digit line 115; however, the memory cells 105 may be arranged in other configurations. By activating (e.g., appropriately biasing) one word line 110 and one digit line 115, a set of memory cells 105 (e.g., a byte of data corresponding to logic values stored in several memory cells 105) may be accessed. Accessing memory cells 105 may include reading or writing (e.g., programming or erasing) memory cells 105. In some cases, the intersection of a word line 110 and digit line 115 may be referred to as an address of a memory cell. NOR flash memory may be addressable (e.g., accessible) at a byte-level.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 145 may include multiple word lines 110, labeled WL_1 through WL_M, and multiple digit lines 115, labeled DL_1 through DL_N, where M and N depend on the array size. Thus, by appropriating biasing a word line 110 and a digit line 115 (e.g., WL_2 and DL_3) the memory cell 105 at their intersection may be accessed.

Upon accessing, a memory cell 105 may be read, or sensed, by sense component 125 to determine the stored state of the memory cell 105. For example, current flowing through the memory cell 105, as dictated by the charge on the floating gate of the memory cell 105, may transfer onto the corresponding digit line 115. The current flowing through the memory cell 105 may be based on biasing (e.g., applying a voltage) to the control gate of the memory cell 105 (e.g., via the corresponding word line 110). The current flowing through the memory cell 105 may be compared to a reference current (not shown) in order to determine the stored state of the memory cell 105. For example, if a digit line 115 has a higher current than the reference current, then sense component 125 may determine that the stored state in memory cell 105 was a logic 1 and vice versa. In some cases, the current may be converted into a voltage that is compared to a reference voltage to determine the logic state of the memory cell 105. Sense component 125 may include various transistors or amplifiers in order to detect and amplify a difference in the signals, which may be referred to as latching. The detected logic state of memory cell 105 may then be output through column decoder 130 as output 135.

A memory cell 105 may be written (e.g., programmed or erased) by biasing the relevant word line 110 and digit line 115. In some cases, activating a word line 110 may bias the digit lines 115 of the corresponding memory cells 105. By biasing the relevant digit line 115 while the word line 110 is activated, a memory cell 105 may be written—i.e., a logic value (e.g., a bit of data) may be stored in the memory cell 105. Column decoder 130 may accept data, for example input 135, to be written to the memory cells 105. A floating gate transistor memory cell 105 may be written by applying a voltage across the floating gate transistor. This process is discussed in more detail below. In some cases, a string or block of data may be stored in memory array 145 by writing to a set of memory cells 105. In such cases, an ECC code may be used during the write operation to enable error detection during a subsequent read operation. According to the techniques described herein, an error detected based at least in part on an ECC operation during a read process may be flagged by setting a hardware interrupt.

The memory controller 140 may control the operation (e.g., read, program, erase, etc.) of memory cells 105 through the various components, such as row decoder 120, column decoder 130, and sense component 125. Memory controller 140 may generate row and column address signals in order to bias the desired word line 110 and digit line 115. Memory controller 140 may also generate and control various voltage potentials used during the operation of memory array 145. In general, the amplitude, shape, or duration of an applied voltage discussed herein may be adjusted or varied and may be different for the various operations for operating memory array 145. Furthermore, one or multiple sets of memory cells 105 within memory array 145 may be accessed simultaneously; for example, multiple (or all) sets of cells of memory array 145 may be accessed simultaneously during a reset operation in which all memory cells 105, or a set of memory cells 105, are set to a single logic state.

Figure 2:
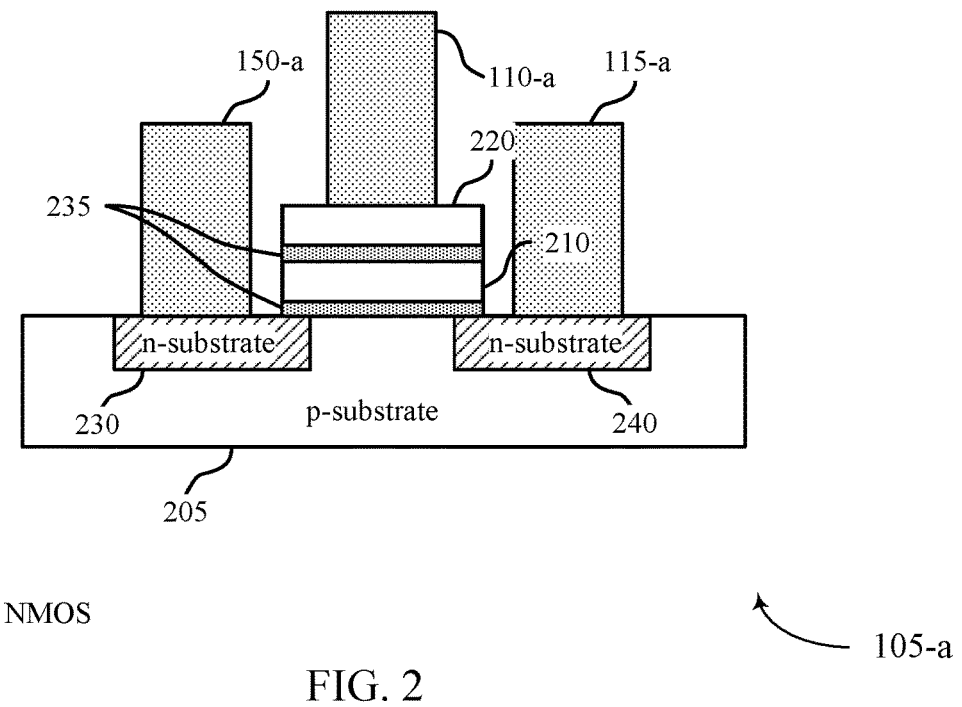
FIG. 2 illustrates an example of a memory cell that supports ECC event detection in accordance with various embodiments of the present disclosure.

Although the techniques disclosed herein are described with reference to floating gate memory cells, the techniques may be implemented using other types of cells that store logic states, such as charge trap memory cells FIG. 2 illustrates an example of a memory cell 105-*a* that supports ECC event detection in accordance with various embodiments of the present disclosure. Memory cell 105-*a* may be an example of a memory 105 described with reference to FIG. 1. Memory cell 105-*a* may include a floating gate transistor (e.g., an FGMOS), which may be similar to a conventional transistor and may include an additional electrode between the gate and the semiconductor.

Memory cell 105-*a* may be an example of a memory cell used in flash memory architecture that is used to store a bit of information. Memory cell 105-*a* may be susceptible to errors. For example, memory cell 105-*a* may experience a phenomenon, referred to herein as bit flipping, in which a stored bit is reversed (e.g., a stored logic 1 becomes a logic 0 or vice versa). Bit flipping may be the result of drifting effects in which the voltage level, or charge, stored by memory cell 105-*a* slowly drifts from its initial value. Bit flipping may also result from over-programming effects in which a programming operation for a set of memory cells 105 inadvertently flips the bit on memory cell 105-*a*. In some cases, bit flipping may result from read-disturb errors in which a read operation for a set of memory cells 105 induces a permanent change of a bit value of one of the sensed memory cells 105 (e.g., memory cell 105-a).

Memory cell 105-a may be a NOR flash memory cell, and as such may be less susceptible to bit flipping than other types of flash memory (e.g., NAND architectures). NOR memory may be used in some applications which require very high reliability (e.g., low error rates). For example, NOR memory may be used in systems and devices in the military, space, and medical fields. As described herein, the high-reliability of NOR memory may be complemented and increased by using an error detection scheme that provides a notification to the device when an error has occurred. A device that learns of an error may take corrective action prior to use of the data associated with the error. Or the device may adjust operations to reduce the likelihood of other errors. In some cases, the device may learn of an error by checking an error flag (e.g., stored in a general purpose register). The device may, additionally or alternatively, learn of the error by monitoring a hardware interrupt node for signaling indicative of the error. Notification of an error via a hardware interrupt node may be faster and introduce less overhead compared with other error detection techniques.

Memory cell 105-a may include source line 150-a, word line 110-a, and digit line 115-a. Word line 110-a may be connected to control gate 220 (e.g., control gate 220 may be accessed via word line 110-a), source line 150-a may be connected to source 230 (e.g., source 230 may be accessed via source line 150-a) and digit line 115-a may be connected to drain 240 (e.g., drain 240 may be accessed by digit line 115-a). Control gate 220 may include an electrode. In the example depicted in FIG. 2, source 230 and drain 240 comprise an n-substrate surrounded by a p-substrate semiconductor 205 (e.g., memory cell 105-a may be an NMOS transistor). In alternative examples, source 230 and drain 240 may comprise a p-sub state surrounded by an n-substrate semiconductor (e.g., memory cell 105-a may comprise a PMOS transistor). When the control gate 220 is biased so that the control gate 220 discharges, a conductive channel may be formed between source 230 and drain 240, allowing current to flow through memory cell 105-a (e.g., from the source 230 to the drain 240). When the control gate 220 is biased so that charge accumulates on the control gate 220, the conductive channel may be restricted so that current does not flow between the source 230 and the drain 240.

Memory cell 105-a may also include a floating gate 210 (e.g., an electrode) between the control gate 220 and the p-substrate semiconductor 205. The floating gate 210 may be isolated from other portions of memory cell 105-a by insulators 235. Insulators 235 may be made of an insulating material, such as an oxide (e.g., metal oxide, silicon oxide, etc.). When memory cell 105-a is properly biased, current may flow through memory cell 105-a (e.g., through a channel between the source 230 and the drain 240). When a sufficiently high current is passed through memory cell 105, electrons flowing through the channel (e.g., from the source 230 to the drain 240) may gain enough kinetic energy to travel through (e.g., via hot-carrier injection) the insulators 235 and accumulate on the floating gate 210. Thus, the floating gate 210 may acquire a negative charge.

The charge on floating gate 210 may remain on the floating gate 210 when power (e.g., a voltage bias) has been removed from memory cell 105 and may indicate a binary state. That is, memory cell 105-a may retain a particular state even when powered down. The charge state of floating gate 210 may be used to represent one bit of data. For example, the presence of charge on the floating gate 210 may indicate a first logic state (e.g., a logic 0) and the absence of charge on the floating gate 210 may indicate a second logic state (e.g., a logic 1). The process of writing or storing a logic 0 at a memory cell 105 may be referred to herein as programming the memory cell 105. The process of writing or storing a logic 1 at a memory cell 105 may be referred to herein as erasing the memory cell 105.

The presence of charge, or lack thereof, on the floating gate 210 may affect the behavior and/or characteristics (e.g., the threshold voltage) of memory cell 105-a. If the floating gate 210 is not charged (e.g., if floating gate 210 has a neutral charge, which corresponds to a logic 1), then memory cell 105-a may operate almost like a conventional transistor. That is, a positive voltage bias applied to the control gate 220 may create a conductive channel in p-substrate substrate 205 that carries a current from the source 230 to the drain 240. If the floating gate 210 is charged (e.g., negatively charged, which corresponds to a stored logic 0) and a positive voltage is applied to the control gate 220, the charge on the floating gate 210 may shield the channel region from the control gate 220 and prevent the formation of a channel between the source 230 and the drain 240, thereby limiting the amount of current flowing through memory cell 105-a. Thus, more current may flow through memory cell 105-a when memory cell 105-a stores a logic 1 (e.g., the floating gate is neutral) than when memory cell 105-a stores a logic 0 (e.g., the floating gate is negative).

Figure 3:
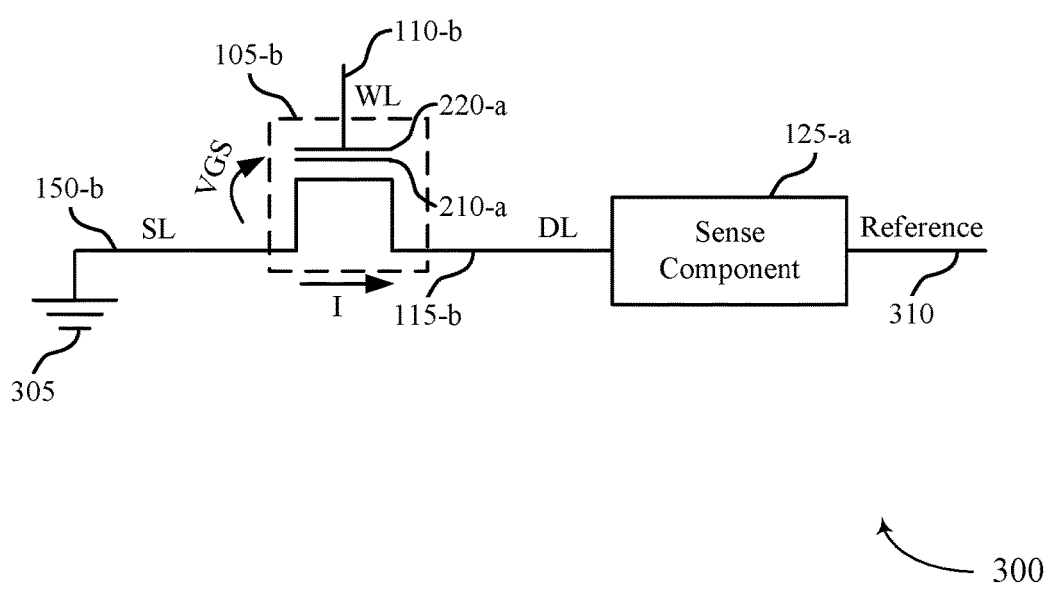
FIG. 3 illustrates an example circuit that includes a memory cell and supports ECC event detection in accordance with various embodiments of the present disclosure.

FIG. 3 illustrates an example circuit 300 that includes a memory cell 105-b and supports ECC event detection in accordance with various embodiments of the present disclosure. Memory cell 105-b may be an example of a memory cell 105 described with reference to FIGS. 1 and 2. Memory cell 105-b may include a source (not shown) that is accessed using source line (SL) 150-b and a drain (not shown) that is accessed using digit line 115-b. Source line 150-b may be connected to a ground reference (e.g., ground 305) so that the source of memory cell 105-b has a neutral voltage or bias (e.g., 0 V). Memory cell 105-b may be selected for an operation (e.g., a read or write operation) using word line (WL) 110-b which is connected to the control gate 220-a of memory cell 105-b.

Memory cell 105-b may be accessed (e.g., written or sensed) by controlling the voltage at control gate 220-a, at the source, and at the drain (e.g., via word line 110-b, source line 150-b, and digit line 115-b, respectively). For example, memory cell 105-b may be written (e.g., programmed or erased) by applying negative and positive voltage biases to control gate 220-a and applying the appropriate voltage biases to the source and drain. The voltage bias on control gate 220-a may be modified using word line 110-b. Memory cell 105-b may also be read (sensed) by applying the appropriate voltages to memory cell 105-b, as discussed below.

To program (e.g., write a logic 0 to) memory cell 105-b, a positive voltage may be applied (e.g., via word line 110-b) to control gate 220-a and a small positive voltage may be applied to the drain (e.g., via digit line 115-b). In such a scenario, the voltage drop from control gate 220-a to source line 150-a-a (e.g., $V_G - V_S = V_{GS}$) may be greater than the threshold voltage (e.g., $V_{Th}$) of the memory cell 105-b. That is, electrons may flow (e.g., in the form of current I) from the source to the drain (e.g., from source line 150-b to digit line 115-b). If the source to drain current is sufficiently high, a number of high-energy electrons may overcome the potential barrier around floating gate 210-a and jump from the conductive channel between the source and the drain (through the insulating layer) onto floating gate 210-*a*. Thus, floating gate 210-*a* may be charged to a first state. The charge may remain on floating gate 210-*a* unless externally manipulated (e.g., by an electric field). In some cases, the charge on floating gate 210-*a* may partially cancel the electric field from control gate 220-*a*, which may shift the threshold voltage of memory cell 105-*b*.

To erase (e.g., write a logic 1 to) memory cell 105-*b*, a negative voltage may be developed between control gate 220-*a* and the source (e.g., $V_{GS}$<0). For example, a negative voltage may be applied (e.g., via word line 110-*b*) to control gate 220-*a* while digit line 115-*b* is grounded. If the applied negative voltage is large enough, the electric field generated by the negative voltage may pull a number of electrons off of the floating gate 210-*a* (e.g., via quantum-mechanical tunneling). Thus, the charge on floating gate 210-*a* may be removed (e.g., electrons from floating gate 210-*a* may be re-injected into the conductive channel) and floating gate 210-*a* may store a logic 1 (e.g., floating gate 210-*a* may have a neutral charge). In some cases, a negative voltage may be developed between control gate 220-*a* and the p-substrate semiconductor to discharge the floating gate 210-*a*.

A voltage may be applied to control gate 220-*a* to read the logic state stored by floating gate 210-*a*. The voltage may be selected low enough so that the charge stored on floating gate 210-*a* is preserved but high enough to distinguish between a charged and uncharged state of floating gate 210-*a*. When an appropriate voltage is applied, memory cell 105-*b* will either stay insulated or become conducting based on the charge present on floating gate 210-*a*. As discussed above, more current may flow through memory cell 105-*b*, and onto digit line 115-*b*, when floating gate 210-*a* has a neutral charge (which corresponds to a logic 1) rather than when floating gate 210-*a* has a negative charge (which corresponds to a logic 0).

Thus, the logic state of memory cell 105-*b* may be determined by comparing the current on digit line 115-*b* (or voltage that results from the current on digit line 115-*b*) to a reference current (or reference voltage). For example, sense component 125-*a* may compare the current on digit line 115-*b* to a reference current provided by reference line 310. The reference current may be between (e.g., midway, or nearly midway) the current corresponding to a logic 1 and the current corresponding to a logic 0. If sense component 125-*a* determines that the current on digit line 115-*b* is greater than the reference current, sense component may determine that memory cell 105-*b* stored a logic 0. If sense component 125-*a* determines that the current on digit line 115-*b* is less than the reference current, sense component may determine that memory cell 105-*b* stored a logic 1.

In some cases, the logic state stored at memory cell 105-*b* may be determined by generating a voltage using the current flowing through memory cell 105-*b* during a read operation. For example, the current may be converted to a voltage by means of a current to voltage converter (e.g., a circuit able to supply to the sense component 125-*a* a voltage whose value depends on the value of the current). In such a scenario, the resulting voltage may be compared to a reference voltage (e.g., supplied by reference line 310) to determine the logic state stored by memory cell 105-*b*.

Figure 4:
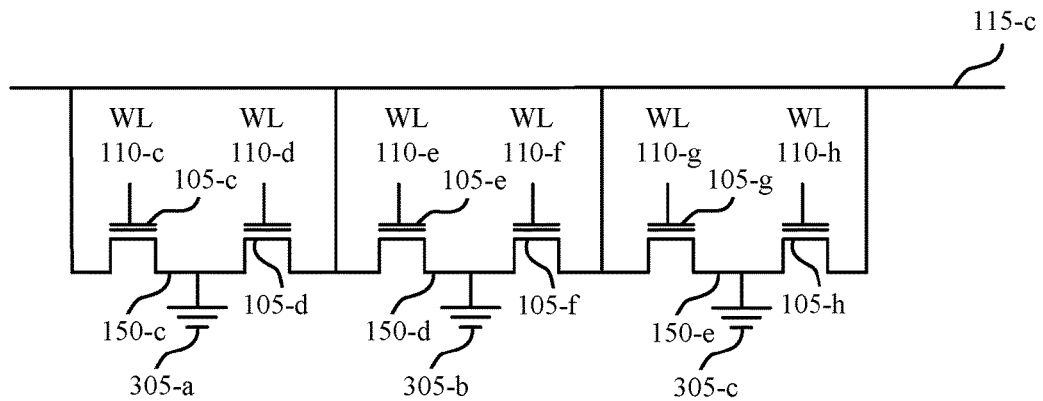
FIG. 4 illustrates an example circuit that includes memory cells and supports ECC event detection in accordance with various embodiments of the present disclosure.

FIG. 4 illustrates an example circuit 400 that includes memory cells 105 and supports ECC event detection in accordance with various embodiments of the present disclosure. Circuit 400 includes memory cell 105-*c* through memory cell 105-*h*, which may be examples of a memory cell 105 as described with reference to FIGS. 1-3. Each memory cell 105 may be accessed using a corresponding word line 110. For example, memory cell 105-*c* may be accessed using word line 110-*c*, memory cell 105-*d* may be accessed using word line 110-*d*, memory cell 105-*e* may be accessed using word line 110-*e*, memory cell 105-*f* may be accessed using word line 110-*f*, memory cell 105-*g* may be accessed using word line 110-*g*, and memory cell 105-*h* may be accessed using word line 110-*h*.

Circuit 400 may be an example of NOR memory in which the memory cells 105 are arranged in a NOR logic configuration. A NOR logic configuration may allow a byte of data to be accessed at a time (e.g., memory cells 105 may be accessed in sets that correspond to bytes of data). In a NOR logic configuration, the drain of each memory cell 105 may be connected to a common digit line 115-*c*, which may represent a data bus. The source lines 150 may connect the sources of the memory cells 105 to a common ground reference (e.g., ground 305). For example, source line 150-*c* may connect the sources of memory cell 105-*c* and memory cell 105-*d* to ground 305-*a*, source line 150-*d* may connect the sources of memory cell 105-*e* and memory cell 105-*f* to ground 305-*b*, and source line 150-*e* may connect the sources of memory cell 105-*g* and memory cell 105-*h* to ground 305-*c*. As discussed above, the voltage applied to the word line 110, source line 150, and digit line 115 of each memory cell 105 may determine the access operation of the memory cell 105 (e.g., a read or write operation).

Circuit 400 may represent a column of memory cells 105. Each memory cell 105 in a column may each have a corresponding word line 110 and share a common digit line 115. Thus, memory cells 105 on shared digit line 115 (e.g., in a column) may be accessed one at a time. Each memory cell 105 in a row (not shown) may have a corresponding digit line 115 and share a common word line 110. Thus, a set of memory cells 105 in row may be accessed at the same time using the shared word line 110 because each memory cell 105 has a different digit line 115 for reading (or writing) the data. The set of memory cells 105 may store logic states representative of bits that are used to form a byte of data. Circuit 400 may be included in a memory array (e.g., a memory array 145 described with reference to FIG. 1) such that a memory cell 105 of circuit 400 may be accessed simultaneously with other memory cells using the same word line 110. Memory cells 105 that are accessed using the same word line 110 may be written to (e.g., programmed or erased) and read without disturbing the state of memory cells 105 that are accessed by a different word line 110. In the example depicted in FIG. 4, if a memory cell 105 storing a logic 1 is sensed (e.g., a read voltage is applied to the corresponding word line 110), the corresponding digit line 115 will be pulled low (because the memory cell 105 will serve as a conductive path between ground 305 and digit line 115-*c*. If the memory cell 105 storing a logic 0 is sensed (e.g., a read voltage is applied to the corresponding word line 110), the corresponding digit line 115 may remain high because the memory cell 105 may isolate ground 305 from digit line 115-*c*).

In some cases, a set of memory cells 105 may be sensed and the corresponding bits may form a data block (or string). For example, a block of data may include the bits from a number of memory cells 105. In some cases, certain operating conditions may degrade or alter the stored state of one or more memory cells 105, which may result in one or more errors during sensing of the memory cells 105. For example, the materials making up the memory cells 105 may deteriorate or neighboring memory cells 105 may disrupt an access operation. To prevent undetected errors, redundancy may be added to blocks of data. For instance, an error correction code (ECC) (e.g., a block code or a convolution code) may be used to encode stored data in such a way that a decoder can identify and, in some cases, correct errors in a data block. When a block of data bits is encoded using ECC, the resulting string of data bits may be referred to as a codeword. A codeword may include multiple bytes. The process of encoding may occur during the write process.

When a codeword is constructed (e.g., identified) from a read operation of a set of memory cells 105, the codeword may be evaluated to determine if an error has occurred. For example, an ECC operation (e.g., ECC decoding) may be performed on the read codeword, and the result of the ECC operation may indicate whether the codeword is error-free, contains a correctable error (e.g., a one bit error), or contains a non-correctable error (e.g., a two bit error). An error in a codeword (e.g., a correctable error or a non-correctable error) may be referred to as an ECC event. Thus, different types of errors (e.g., 1 bit errors and 2 bit errors) may be categorized as an ECC event. In some cases, detection of an ECC event may be indicated by triggering a hardware interrupt pin as discussed herein. Although described with respect to a particular ECC implementation, the techniques disclosed herein are applicable to various types of errors, ECC events, and ECC implementations. For example, the techniques described herein may be applicable to ECC schemes with different levels of detectability and correctibility.

Figure 5:
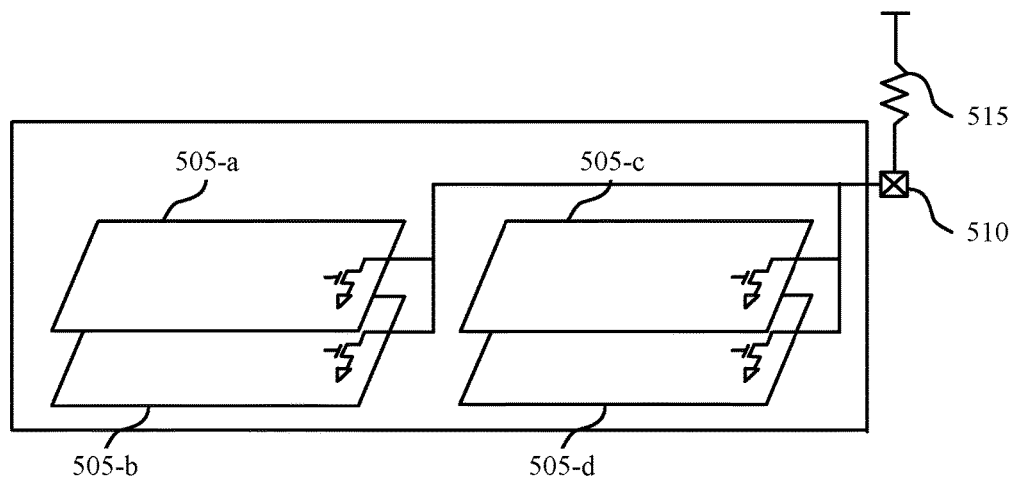
FIG. 5 illustrates an example package that supports ECC event detection in accordance with various embodiments of the present disclosure.

FIG. 5 illustrates an example of a package 500 that supports ECC event detection in accordance with various embodiments of the present disclosure. Package 500 may include (e.g., enclose) a number of dies 505 (e.g., 4 dies), including die 505-a, die 505-b, die 505-c, and die 505-d. Each die 505 may include a number of memory cells 105, such as those described with reference to FIGS. 1-4. The memory cells 105 may be arranged in a parallel or in serial configurations. A parallel configuration may support either separate or multiplexed address and data busses, while a serial configuration may support data transfers of 1, 2, or 4 bits in host-controlled synchronous transfers. Package 500 may be included in a memory array 145, such as described with reference to FIG. 1.

Each die 505 may have a storage capacity (e.g., 512 megabytes (MBs)). In some cases, multiple dies 505 may be stacked so that they appear, and function, as a single die 505. For example, die 505-a and die 505-b may be stacked so that the storage capacity is effectively doubled (e.g., to 1 gigabyte (GB)). In such cases, a single command may be used to access memory cells 105 in the stacked dies 505 (e.g., in either die 505-a or die 505-b). Thus, access to memory cells 105 included in a die 505 may occur on per-die basis or on a stacked-die basis.

In accordance with the techniques described herein, a set of memory cells 105 within package 500 may be selected for a read operation. During the read operation, the state of each memory cell 105 may be sensed. In some cases, an ECC event may be detected in a codeword that is identified from the read operation. The detected ECC event may be flagged by sending a signal to a hardware interrupt node. For example, a voltage may be generated on interrupt node 510 when an ECC event is detected for a codeword read from any of the dies 505 included in package 500. The interrupt node 510 may be configured with an open drain setup (enabled by pull-up resistor 515) so that the interrupt node 510 is capable of being triggered by multiple dies 505. In some cases, an indication of the detected ECC event may be stored (e.g., in memory or in a general purpose register) in lieu of, or in addition to, triggering the interrupt node 510.

The indication of the detected ECC event may include information regarding the type of ECC event and/or the address location of the memory cells 105 associated with the ECC event. The stored ECC event information may be cumulative (e.g., a list of locations where ECC events have occurred and, in some examples, the types of ECC events).

Figure 6:
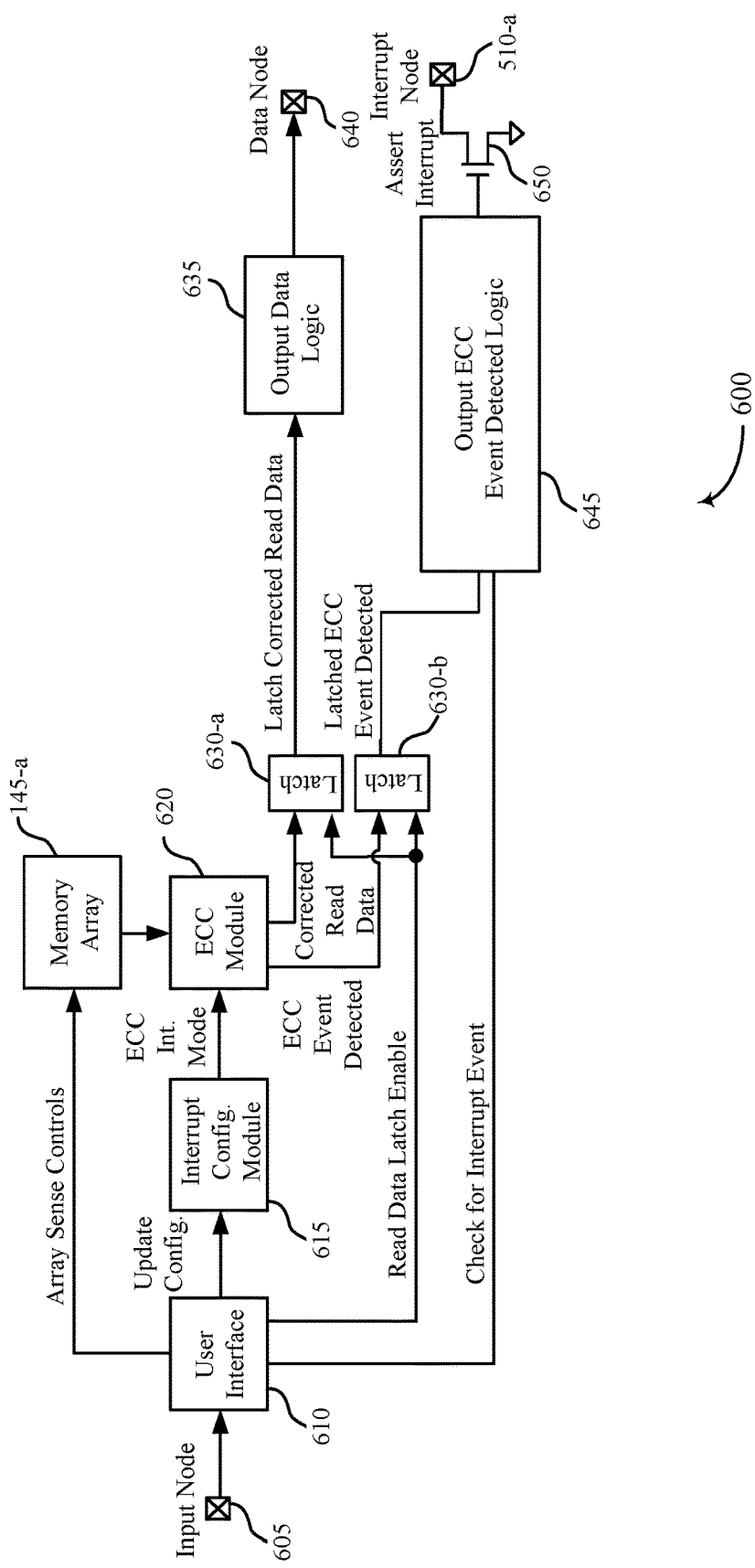
FIG. 6 illustrates an example of a circuit that supports ECC event detection in accordance with various embodiments of the present disclosure.

FIG. 6 illustrates an example of a circuit 600 that supports ECC event detection in accordance with various embodiments of the present disclosure. Circuit 600 may be in electronic communication with a device or system (e.g., an advanced driver assistance system (ADAS)), and data and ECC events may be communicated to or from the device or system. In some examples, circuit 600 may be included in a package (e.g., a package 500 as described with reference to FIG. 5). Circuit 600 may be configurable (e.g., by a user) to detect different types of ECC events. An ECC event may be indicated by triggering a hardware interrupt pin or an ECC event may be logged in a storage portion of circuit 600 (or in a storage location accessible by the device or system in electronic communication with circuit 600), or both. For example, a detected ECC event may be indicated by producing a measureable signal (e.g., a voltage) on interrupt node 510-a and the occurrence of the event may be logged for future use.

Circuit 600 may include an input node (or pad) 605. Input node 605 may receive inputs (e.g., commands) from a user and pass signals (e.g., electrical signals) corresponding to the inputs to user interface 610. User interface 610 may receive, and decode, user-input command signals from input node 605. User interface 610 may use information from the decoded commands to configure and control other components of circuit 600. For example, user interface 610 may configure or update interrupt configuration module 615 in response to a user issuing an appropriate command through input node 605. User interface 610 may control the operations of other components of circuit 600 via signaling. For example, user interface 610 may be in electronic communication with, and pass signals to, memory array 145-a, interrupt configuration module 615, latch 630-a, latch 630-b, output ECC event detected logic 645, and interrupt node 510-a.

User interface 610 may pass array sense control signals to memory array 145-a. The array sense control signals may cause memory array 145-a to perform access operations for memory cells 105 included in memory array 145-a. For example, the array sense control signals may cause a read (sense) or write operation for a set of memory cells in memory array 145-a. User interface 610 may also send signals (e.g., read data latch enable signals) to latches 630. The signals may prompt latches 630 to store signals at the output of latches 630. In some cases, user interface 610 may send control signals (e.g., check for interrupt event signals) to output ECC event detected logic 645. The signals may cause the output ECC event detected logic 645 to output an interrupt indication (e.g., an assert interrupt signal) to interrupt node 510-a. The interrupt indication may be based at least in part on the output state of latch 630-b.

Interrupt configuration module 615 may be a register and may be responsible for enabling or disabling ECC event (e.g., error) detection. If ECC event detection is enabled, interrupt configuration module 615 may select which error detection mode is to be implemented. For example, each error detection mode may detect a unique type (or combination of types) of error or ECC event. In a first error detection mode, one bit errors and/or corrections are detected and reported (e.g., indicated). In some examples of the first error detection mode, two bit errors may be detected but not reported. In a second error detection mode, two bit errors are detected and reported (e.g., indicated). In some examples of the second error detection mode, one bit errors may be detected but not reported. In a third error detection mode, both one bit errors and two bit errors are detected and reported. For instance, different error types detected in different codewords may be reported (e.g., a one bit error detected in a first codeword may be reported and a two bit error detected in second codeword may also be reported). Although described with reference to three error detection modes, the techniques described herein are applicable to other error detection modes (e.g., error detection modes that recognize different combinations and/or types of errors or ECC events). Once configured, interrupt configuration module 615 may relay the configuration information to the ECC module 620.

ECC module 620 may detect errors in codewords received from memory array 145-a. Memory array 145-a may include a number of memory cells 105 (e.g., memory array 145-a may be an example of a memory array 145 described with reference to FIG. 1). Codewords that are identified from a read operation of memory array 145-a may be passed to ECC module 620, which may perform ECC error detection operations (e.g., ECC decoding). When ECC module 620 detects an ECC event that the ECC module 620 is configured to report, the ECC module 620 may send an indication of the ECC event to latch 630-b. For example, the ECC module 620 may send an ECC event detected signal to latch 630-a when a one bit error has been detected and ECC module 620 is in the first error detection mode. ECC module 620 may also correct the one bit error. ECC module 620 may pass corrected read data signals onto latch 630-a.

Latch 630-a may receive corrected read data signals from ECC module 620 (e.g., at the first input) and latch, or store, the corrected read data signals (e.g., at the output) when a read data latch enable signal is received from the user interface 610 (e.g., at the second input). The corrected read data signals that are stored at the output of latch 630-a may be preserved irrespective of changes at the first input of latch 630-a (e.g., irrespective of a change in the corrected read data signals). Thus, new data may be sensed without losing the data that has previously been sensed. The corrected read data signals that are stored at the output of latch 630-a may be passed on to the output data logic 635, which may process or prepare the read data for transmission to data node 640, or both. The data signals at data node 640 may be accessible to other components, systems, or devices that are in electronic communication with circuit 600.

Latch 630-b may receive signals indicative of a detected ECC event from ECC module 620 and signals from user interface 610 that enable latching of the ECC event detected signals. When an ECC event detected signal is present at the first input of latch 630-b, and read data latch enable signal is present at the second input of latch 630-a, the ECC event detected signal may be latched, or stored, at the output of latch 630-b. The ECC event detected signal that is latched, or stored, at the output of latch 630-b may be preserved irrespective of changes at the first input of latch 630-b (e.g., irrespective of a change in the ECC event detected signal). The ECC event detected signal that is stored at the output of latch 630-b may be passed, or transmitted, to output ECC event detected logic 645. Output ECC event detected logic 645 may, based on the inputs, generate an assert interrupt signal at the output of output ECC event detected logic 645. The assert interrupt signal may be transmitted to interrupt node 510-a. For example, the assert interrupt signal may be transmitted e.g., via transistor 650, which may be in electronic communication with interrupt node 510-a, and which may be in an open drain configuration so that the drain is connected to interrupt node 510-a.

The assert interrupt signal may change the voltage of interrupt node 510-a from a first value to a second value. The signal (e.g., voltage) of interrupt node 510-a may be measurable and may be based on the output state of state of latch 630-b. Thus, other components, devices, or systems may learn of the ECC event by monitoring interrupt node 510-a. If a device determines that a threshold number of ECC events have been detected within a period of time, the device may modify its behavior to mitigate or accommodate the ECC events. For example, if the number of detected one bit errors is greater than a threshold value, the device may issue commands that mitigate the likelihood of one bit errors. For instance, the device may refresh the states of memory cells 105 within memory array 145-a. In another example, if the device determines that an ECC event is a two bit error, the device may decide that the data associated with the two bit error is untrustworthy and perform a second read operation on the corresponding memory cells 105.

Figure 7:
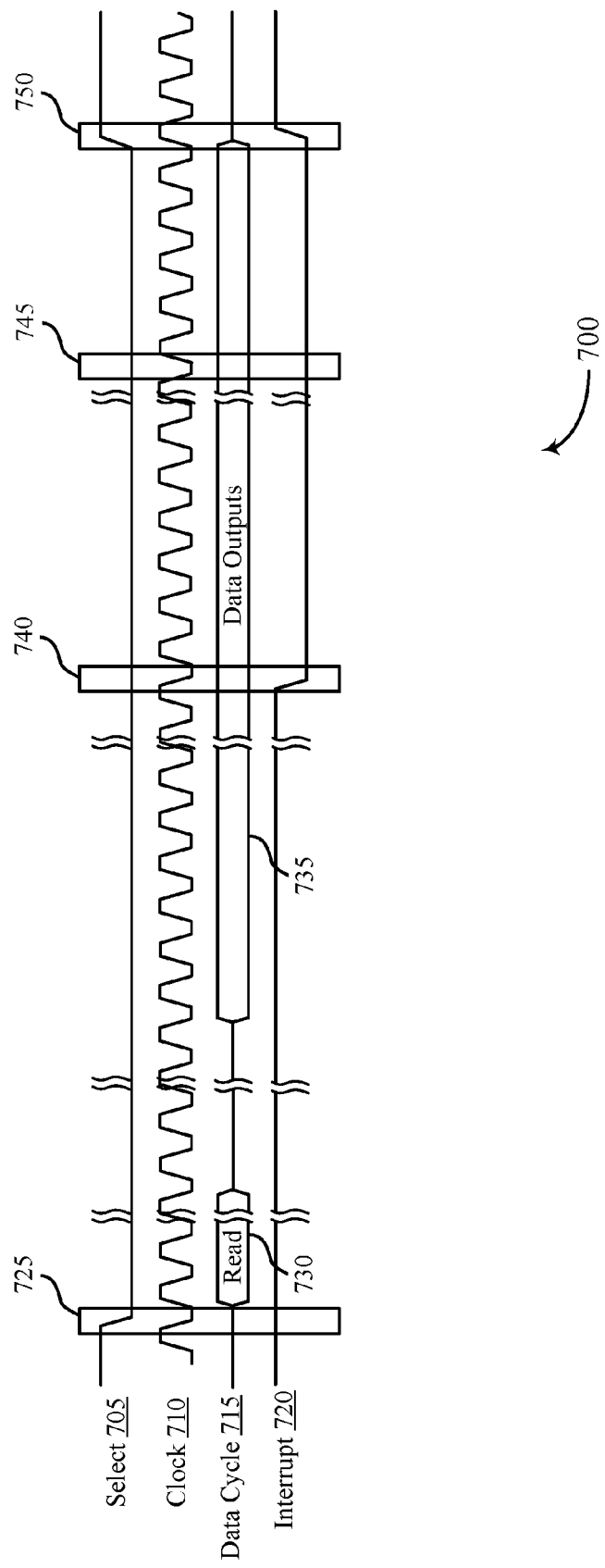
FIG. 7 illustrates an example timing diagram for ECC event detection in accordance with various embodiments of the present disclosure.

FIG. 7 illustrates an example timing diagram 700 for ECC event detection in accordance with various embodiments of the present disclosure. Timing diagram 700 may be an example of a read command sequence in a serial peripheral interface (SPI) protocol with an interrupt event. Timing diagram 700 may include a select signal 705 which may be used to select memory cells (e.g., at a die-level, package-level, array-level, or device-level) for access operations (e.g., read and write operations). Timing diagram 700 may also include a clock signal 710, which may be used to synchronize the timing of access operations (e.g., for components of a circuit 600 as described with reference to FIG. 6). Timing diagram 700 may also include a data cycle signal 715 which may represent data involved in an access operation that is sent over a data line between two components. In the example depicted in FIG. 7, the data cycle signal 715 may represent data (e.g., codewords) that is read from a memory array 145. Timing diagram 700 may also include an interrupt signal 720, which may represent the signal at an interrupt node (e.g., an interrupt node 510 or 510-a such as described with reference to FIGS. 5 and 6, respectively). For example, interrupt signal 720 may represent the voltage on an interrupt node.

At 725 the select signal 705 may modified (e.g., dropped to decreased) to initiate an access command (e.g., a read command) for the selected component or device. At 730, a read command may be issued using data cycle signal 715. The read command may include information (e.g., memory cell address information) that enables a read operation to be performed. In response to the read command, and at 735, data may be read (e.g., from the selected memory cells) and transferred as data cycle signal 715. The interrupt signal 720 may be high (unless actively pulled low) due to an open drain configuration of the circuit corresponding to the timing diagram 700 (e.g., circuit 600). At 740, the interrupt signal 720 may be modified (e.g., changed from a first (high) value to a second (low) value). The modification may be in response to a detected ECC event (e.g., an error in a codeword read from a set of memory cells). In the example depicted in FIG. 7, the interrupt signal 720 may be dropped from the first byte (or first bits) of the codeword that has the ECC event. The interrupt signal 720 may be maintained (e.g., at 745) at the modified value irrespective of other detected ECC events or data signals (e.g., output data) from subsequent codewords. For example, at 745, the interrupt signal 720 (which may be a voltage) may be maintained at the second value (e.g., low) irrespective of the detection of another error (e.g., an error in a codeword from different set of memory cells). In another example, the interrupt signal 720 may be maintained at the second value even if a new set of memory cells (e.g., located on a different die) is selected. Preservation of interrupt signal 720 at the second value may ensure notification of an ECC event at high read output frequencies.

The interrupt signal 720 may be preserved until 750, at which point the interrupt signal 720 may be changed from the second value (e.g., low) to the first value (e.g., high). The change may be in response to a change in the select signal 705, which may de-select the set of memory cells. In some cases, the change may be in response to the determination that a period of time has elapsed since the ECC event has been detected. For example, the change may be in response to the expiry of a timer. In other examples, the change may be in response to a reset by the system (e.g., a reset triggered autonomously or by a user input). The criteria or procedure for resetting the interrupt signal 720 may be automatically selected by the system or configured by a user (e.g., via a user interface).

Figure 8:
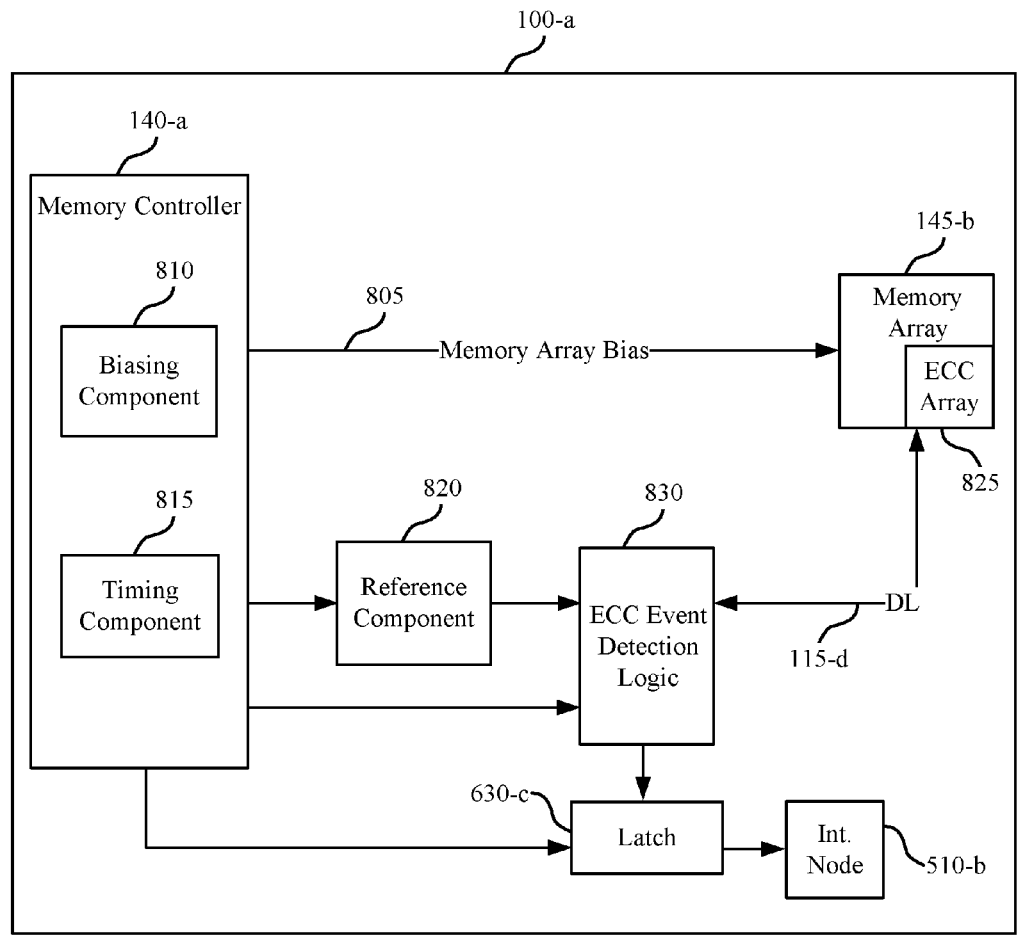
FIG. 8 illustrates a block diagram of an example of a memory component that supports ECC event detection in accordance with various embodiments of the present disclosure.

FIG. 8 shows a block diagram 800 of a memory component 100-a that supports ECC event detection in accordance with various embodiments of the present disclosure. Memory component 100-a may be referred to as an electronic memory apparatus. Memory component 100-a includes memory controller 140-a and memory array 145-a, which may be examples of memory controller 140 and memory array 145 described with reference to FIGS. 1 and 2. Memory controller 140-a may be in electronic communication with a user interface and may operate the components of memory component 100-a (e.g., by issuing commands to biasing component 810 and timing component 815) as described with reference to FIGS. 1-7. Memory controller 140-a may be in electronic communication with memory array 145-a, reference component 820, ECC event detection logic 830, and latches 630-c. The components of memory component 100-a may be in electronic communication with each other and may perform the functions described with reference to FIGS. 1-7. All or some of the elements of memory component 100-a may be housed within a package 500 as described with reference to FIG. 5.

Memory array 145-b may include a number of memory cells 105 such as described with reference to FIGS. 1-7. For example, memory array 145-b may include multiple sets of cells that are in electronic communication with interrupt node 510-b. In some cases, the multiple sets of cells are positioned on multiple dies as described with reference to FIG. 5. Memory array 145-b may also include an ECC array 825 that is in electronic communication with memory array 145-c and that includes memory cells for ECC operations. Although shown included in memory array 145-b, the ECC array 825 may be external to memory array 145-b. In one example, ECC array 825 and memory array 145-b may be part of a dual inline memory module (DIMM).

Memory controller 140-a may be configured to apply memory array bias 805 to memory array 145-a. For example, memory controller 140-a may apply voltage to various nodes and lines within memory array 145-a, including word line(s) and digit line(s) (e.g., digit lines 115-d). For instance, biasing component 810 may be configured to apply a voltage to operate memory cells (e.g., sets of memory cells) within memory array 145-a to read or write the memory cells as described above. The biasing may be in response to a command (e.g., a read command) from another component or a user input. In some cases, memory controller 140-a may include a row decoder, column decoder, or both, as described with reference to FIG. 1. This may enable memory controller 140-a to access one or more memory cells within memory array 145-a. Biasing component 810 may also provide voltage potentials to reference component 820 in order to generate a reference signal (e.g., a reference voltage or a reference current) for use by other components of memory component 100-a. Additionally, biasing component 810 may provide voltage potentials or commands for the operation of ECC event detection logic 830.

In some cases, memory controller 140-a may perform its operations using timing component 815. For example, timing component 815 may control the timing of various commands, signals, and biasing applications, including timing for voltage application to perform the memory functions, such as reading and writing, discussed herein. In some cases, timing component 815 may control the operations of biasing component 810.

Reference component 820 may include various components to generate a reference signal for ECC event detection logic 830. Reference component 820 may include circuitry specifically configured to produce one or more reference signals (e.g., reference voltages and/or reference currents). For example, reference component 820 may provide a first reference signal to ECC event detection logic 830 for use in a sense operation of memory array 145-a and a second reference signal to ECC event detection logic 830 for an ECC operation of ECC array 825.

ECC event detection logic 830 may include various components from circuit 600 described with reference to FIG. 6 and may perform aspects of the corresponding operations as well. ECC event detection logic 830 may sense the states of memory cells within memory array 145-b, and/or ECC array 825, by comparing signals from the memory cells (through digit lines 115-d) with reference signals from reference component 820. In some cases, sense component 125-c may perform aspects of ECC event detection such as described herein.

ECC event detection logic 830 may identify a code word from a read operation of a set of memory cells included in memory array 145-a of memory component 100-a. The identification may involve sensing the states of the memory cells. ECC event detection logic 830 may detect an error associated with the sensed state of the set of memory cells (e.g., ECC event detection logic 830 may detect an error in the identified codeword based on an ECC operation associated with the codeword). The error may be a one bit error or a two bit error (or another type of error) and may be corrected using ECC. Upon detection of the error, ECC event detection logic 830 may transmit a signal indicative of the error to interrupt node 510-b. For example, ECC event detection logic 830 may change a voltage of interrupt node 510-b from a first value to a second value in response to detecting the error.

Thus, memory component 100-a may indicate that an error has been detected based at least in part on changing the voltage of interrupt 510-b (e.g., the memory component 100-a may enable determination that an error has been detected). For example, components of memory component 100-a, and/or components and devices in communication with memory component 100-a, may determine that an error has been detected based at least in part on changing the voltage of interrupt node 510-b. In some cases, the signal may be latched (e.g., via latch 630-c) prior to transmitting the signal to interrupt node 510-b. Latch 630-c may be in electronic communication with the ECC array 825 and may be operable to change an output state based at least in part on a read operation of the ECC array 825 (e.g., a read operation for an ECC operation). Latches 630-c may also be in electronic communication with interrupt node 510-b so that the latched signal may be transmitted to interrupt node 510-b during a subsequent read operation by the ECC event detection logic 830. Thus, a signal (e.g., a voltage) measurable at interrupt node 510-b may be based at least in part on the output state of the latch. In some cases, memory component 100-a may store an indication of the detected error in a storage portion of memory component 100-a.

ECC event detection logic 830 may be dynamically configurable to operate in different error detection modes. For example, ECC event detection logic 830 may select which type of error (ECC event) to detect in response to a user input. The types of errors detectable by ECC event detection logic 830 may include one bits errors, two bit errors, one bit and two bit errors, or other types of errors. ECC event detection logic 830 may also be enabled or disabled (e.g., in response to a user input). For example, ECC event detection logic 830 may detect an error when its error detection mode is enabled and may ignore an error, or refrain from perform ECC operations to detect errors, when its error detection mode is disabled.

In some examples, the read operation performed by the ECC event detection logic 830 may include selecting a set of memory cells for sensing (e.g., by activating the appropriate word lines). The set of cells may be associated with the codeword that has the error. A read voltage may be applied to the set of memory cells (e.g., to the corresponding word lines) so that current flows through the memory cells according to the state of the memory cells (e.g., as determined by the charge on the floating gates of the memory cells). The ECC event detection logic 830 may determine the voltage corresponding to each memory cell (e.g., the voltage that corresponds to the current from each memory cell) based at least in part on the application of the read voltage. The ECC event detection logic 830 may compare the voltage from each memory cell to a reference voltage and the state of each memory cell may be determined based at least in part on the comparison. Thus, the code word identified by the ECC event detection logic 830 may be based at least in part on the determination of the voltage corresponding to each memory cell.

In some examples, the set of memory cells selected for the read operation may be deselected (e.g., by changing the bias applied to the corresponding word lines) and a new set of memory cells may be selected. In such cases, the voltage of interrupt node 510-b may be changed from the second value to the first value. The deselection may occur after determining that an error has been detected. In some examples, it may be determined (e.g., by timing component 815) that a threshold amount of time has elapsed since determining that the error has been detected. The voltage of interrupt node 510-b may be changed to the first value based at least in part on the determination that the threshold amount of time has elapsed. In some cases, ECC event detection logic 830 may detect another error associated with a different set of memory cells. The voltage at interrupt node 510-b may be maintained at the second value irrespective of the detection of the other error.

Figure 9:
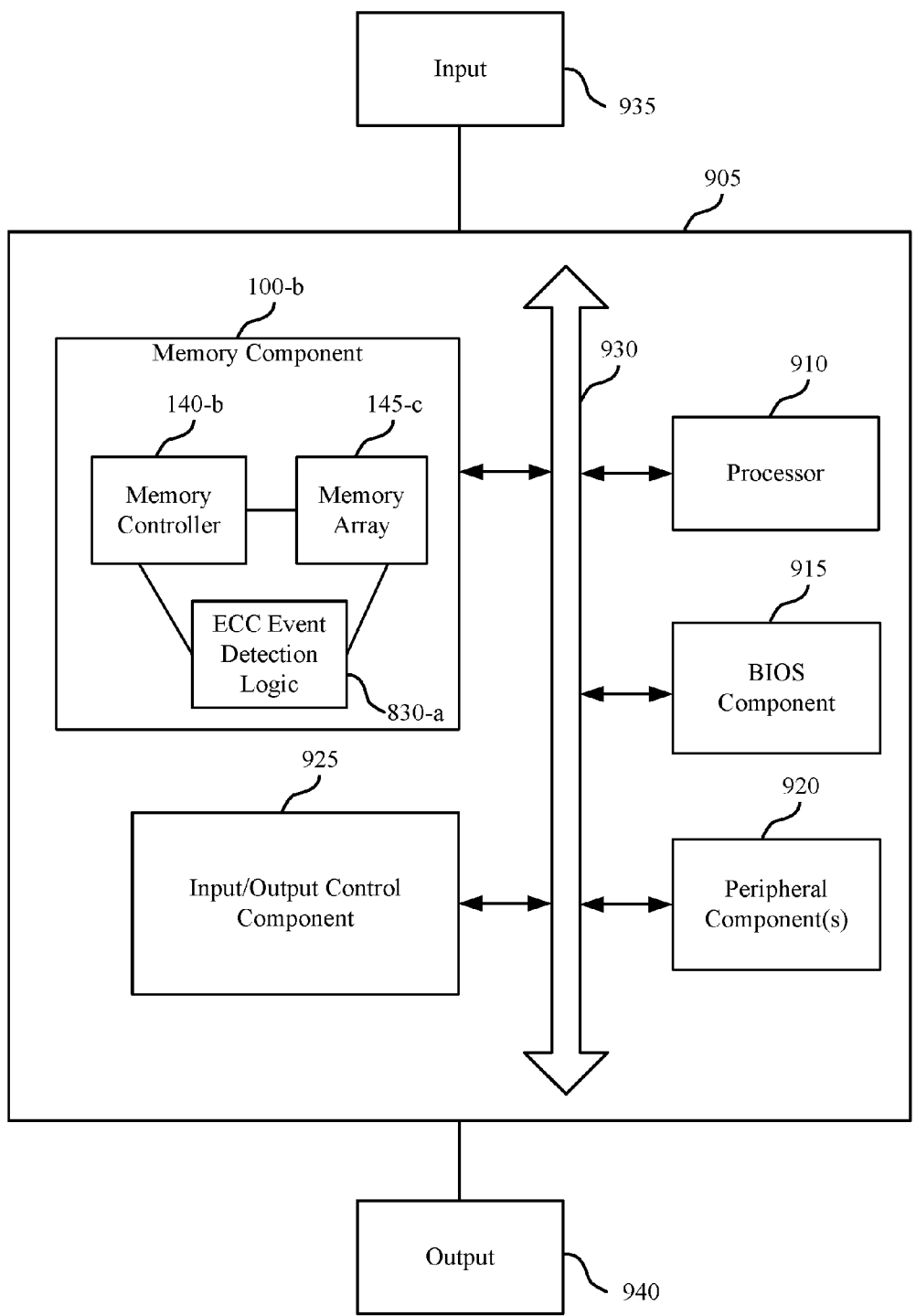
FIG. 9 illustrates a system, including a memory component, that supports ECC event detection in accordance with various embodiments of the present disclosure.

FIG. 9 illustrates a system 900 that supports ECC event detection in accordance with various embodiments of the present disclosure. System 900 includes a device 905, which may be or include a printed circuit board to connect or physically support various components. Device 905 may also be referred to as an electronic memory apparatus. Device 905 includes a memory component 100-b, which may be an example of memory component 100 described with reference to FIG. 1 and FIG. 8. Memory component 100-b may include memory controller 140-b, ECC event detection logic 830-a, and memory array 145-c. Device 905 may also include a processor 910, BIOS component 915, peripheral component(s) 920, and input/output control component 925. The components of device 905 may be in electronic communication with one another through bus 930.

Processor 910 may be configured to operate memory component 100-b through memory controller 140-b. Processor 910 may be configured or controlled via input 935. In some cases, processor 910 may perform the functions of memory controller 140 described with reference to FIGS. 1 and 8. In other cases, memory controller 140-b may be integrated into processor 910. Processor 910 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 910 may perform various functions described herein, including ECC event detection and notification. Processor 910 may, for example, be configured to execute computer-readable instructions to cause device 905 perform various functions or tasks.

BIOS component 915 may be a software component that includes a basic input/output system (BIOS) operated as firmware, which may initialize and run various hardware components of system 900. BIOS component 915 may also manage data flow between processor 910 and the various components, e.g., peripheral components 920, input/output control component 925, etc. BIOS component 915 may include a program or software stored in read-only memory (ROM), flash memory, or any other non-volatile memory.

Peripheral component(s) 920 may be any input or output device or system, or an interface for such devices and systems, that is integrated into device 905. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 925 may manage data communication between processor 910 and peripheral component(s) 920, input devices 935, or output devices 940. Input/output control component 925 may also manage peripherals not integrated into device 905. In some cases, input/output control component 925 may represent a physical connection or port to the external peripheral.

Input 935 may represent a device or signal external to device 905 that provides input to device 905 or its components. This may include a user interface (e.g., such as described with reference to FIG. 6) or interface with or between other devices. In some cases, input 935 may be a peripheral that interfaces with device 905 via peripheral component(s) 920 or may be managed by input/output control component 925.

Output 940 may represent a device or signal external to device 905 configured to receive output from device 905 or any of its components. Examples of output 940 may include a display, audio speakers, a printing device, another processor or printed circuit board, etc. In some cases, output 940 may be a peripheral that interfaces with device 905 via peripheral component(s) 920 or may be managed by input/output control component 925.

The components of memory controller 140-b, device 905, and memory array 145-c may be made up of circuitry designed to carry out their functions. This may include various circuit elements, for example, conductive lines, transistors, capacitors, inductors, resistors, amplifiers, or other active or inactive elements, configured to carry out the functions described herein.

Figure 10:
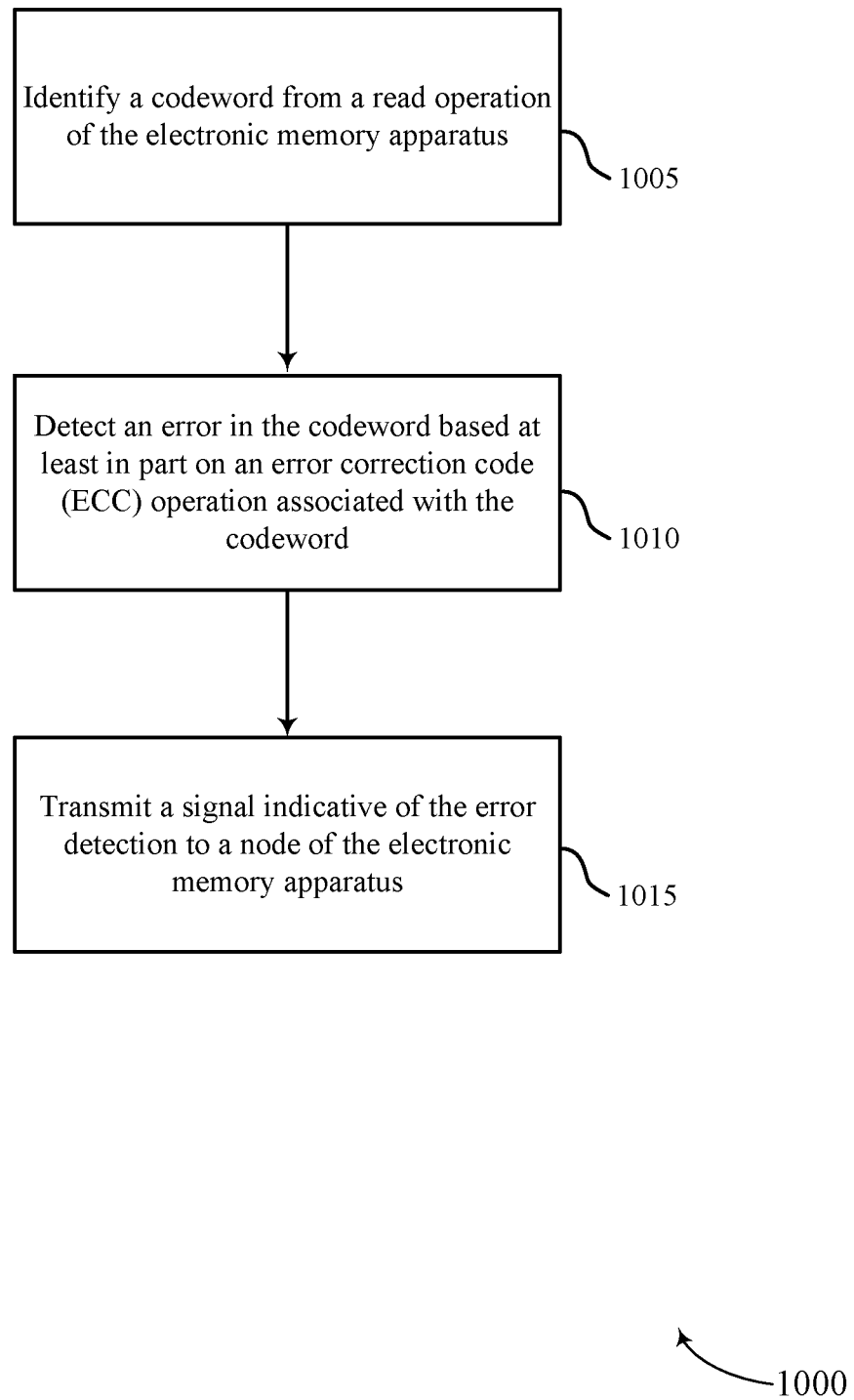
FIGS. 10 and 11 are flowcharts that illustrate a method or methods for ECC event detection in accordance with various embodiments of the present disclosure.

FIG. 10 shows a flowchart illustrating a method 1000 for ECC event detection in accordance with various embodiments of the present disclosure. The operations of method 1000 may be implemented by a memory component 100, as described with reference to FIGS. 1, 8, and 9. For example, the operations of method 1000 may be performed by a memory controller 140 included in a memory apparatus as described with reference to FIGS. 1, 8, and 9. In some examples, a memory controller 140 may execute a set of codes to control the functional elements of the memory array 145 to perform the functions described below. Additionally or alternatively, the memory controller 140 may perform the functions described below using special-purpose hardware.

At block 1005, the method may include identifying a codeword from a read operation of an electronic memory apparatus, as described with reference to FIGS. 1-9. In some cases, the method may include enabling an error detection mode. Thus, the error in the codeword may be detected based at least in part on enabling the error detection mode. In some cases, the method may include, selecting a type of error to be detected and reported (e.g., a one bit error, a two bit error, or both) in response to a user input. In some examples, the method may include applying a first voltage to a set of memory cells associated with the codeword and determining a voltage corresponding to each memory cell of the set of memory cells based at least in part on the application of the first voltage. The codeword may be identified based at least in part on the determination of the voltages corresponding to each memory cell. In certain examples, the operations of block 1005 may be performed or facilitated by the ECC module 620 or the ECC event detection logic 830, as described with reference to FIGS. 6 and 8, respectively.

At block 1010, the method may include detecting an error in the codeword based at least in part on an ECC operation associated with the codeword, as described with reference to FIGS. 1-9. The detected error may be a one bit error or a two bit error. In some cases, the method may include determining that the error is a one bit error and correcting the one bit error. In certain examples, the operations of block 1010 may be performed or facilitated by the ECC module 620 or the ECC event detection logic 830, as described with reference to FIGS. 6 and 8, respectively.

At block 1015, the method may include transmitting a signal indicative of the error detection to a node of the electronic memory apparatus, as described with reference to FIGS. 1-9. In some examples, the method may include latching the signal prior to transmitting the signal to the node. The latched signal may be transmitted to the node during a subsequent read operation. In some cases, the method may include storing an indication of the detected error in a storage portion of the electronic memory apparatus. In certain examples, the operations of block 1015 may be performed or facilitated by the ECC module 620 or the ECC event detection logic 830, as described with reference to FIGS. 6 and 8, respectively.

Figure 11:
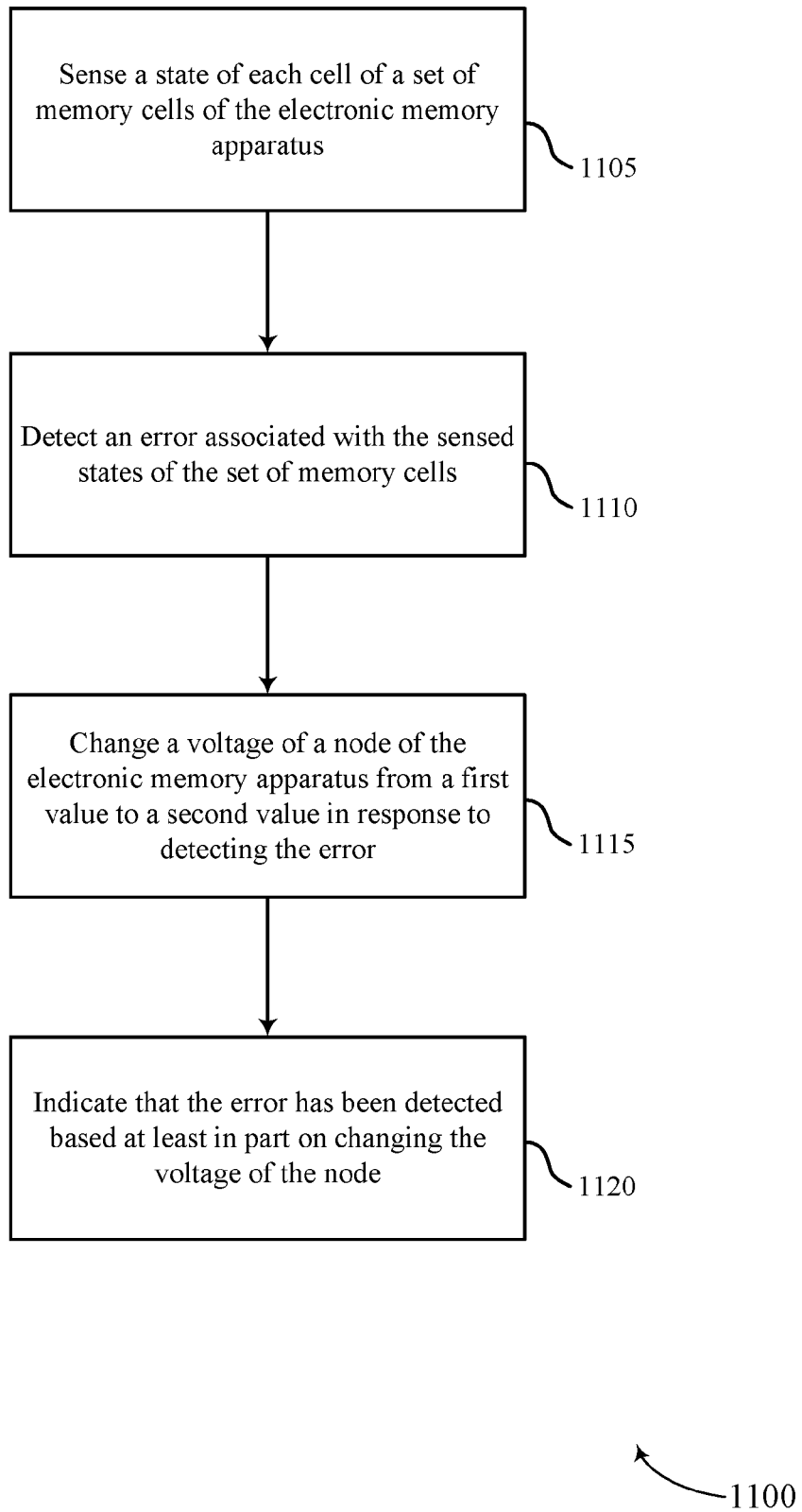

FIG. 11 shows a flowchart illustrating a method 1100 for ECC event detection in accordance with various embodiments of the present disclosure. The operations of method 1100 may be implemented by a memory component 100 included in a memory apparatus, as described with reference to FIGS. 1, 8, and 9. For example, the operations of method 1100 may be performed by a memory controller 140 as described with reference to FIGS. 1, 8, and 9. In some examples, a memory controller 140 may execute a set of codes to control the functional elements of the memory array 145 to perform the functions described below. Additionally or alternatively, the memory controller 140 may perform the functions described below using special-purpose hardware.

At block 1105, the method may include sensing a state of each cell of a set of memory cells of an electronic memory apparatus, as described with reference to FIGS. 1-9. In some examples, the method may include selecting the set of memory cells for sensing. Sensing the set of memory cells may include comparing a voltage or current from each memory cell to a reference voltage or current. The state of each memory cell may be determined based at least in part on the comparison for each respective memory cell. In some examples, the method may include configuring, responsive to a user input, a type of error to be detected (e.g., a one bit error, a two bit error, or both). In certain examples, the operations of block 1105 may be performed or facilitated by the ECC module 620 or the ECC event detection logic 830, as described with reference to FIGS. 6 and 8, respectively.

At block 1110, the method may include detecting an error associated with the sensed states of the set of memory cells, as described with reference to FIGS. 1-9. In certain examples, the operations of block 1110 may be performed or facilitated by the ECC module 620 or the ECC event detection logic 830, as described with reference to FIGS. 6 and 8, respectively.

At block 1115, the method may include changing a voltage of a node of the electronic memory apparatus from a first value to a second value in response to detecting the, as described with reference to FIGS. 1-9. The method may also include changing the voltage of the node to the first value based at least in part on a deselection of the set of memory cells. In some examples, the method may include determining that a threshold amount of time has elapsed since determining that the error has been detected and changing the voltage of the node to the first value based at least in part on the determination. In some cases, the method may include detecting another error associated with a different set of memory cells and maintaining the voltage of the node at the second value irrespective of the detection of the other error. The deselection may occur after determining that the error has been detected. In certain examples, the operations of block 1115 may be performed or facilitated by the ECC module 620 or the ECC event detection logic 830, as described with reference to FIGS. 6 and 8, respectively.

At block 1120, the method may include indicating that the error has been detected based at least in part on changing the voltage of the node, as described with reference to FIGS. 1-9. In certain examples, the operations of block 1120 may be performed or facilitated by the ECC module 620 or the ECC event detection logic 830, as described with reference to FIGS. 6 and 8, respectively.

Thus, methods 1000 and 1100 may provide for ECC event detection. It should be noted that methods 1000 and 1100 describe possible implementations, and the operations and steps may be rearranged or otherwise modified such that other implementations are possible. In some examples, features from two or more of the methods 1000 and 1100 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 145, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device that includes a source, drain, and gate. Alternatively, the transistor or transistors may represent a floating gate metal-oxide-transistor (FGMOS) and comprise a three terminal device that includes a source, drain, control gate, and floating gate. The transistor terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the transistor may be referred to as a n-type transistor. If the channel is p-type (i.e., majority carriers are holes), then the transistor may be referred to as a p-type transistor. The channel may be capped by an insulating gate oxide. The channel conductivity may be controlled by applying a voltage to the gate. For example, applying a positive voltage or negative voltage to an n-type transistor or a p-type transistor, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating an electronic memory apparatus, comprising:
    selecting a set of memory cells of the electronic memory apparatus for sensing;
    sensing a state of each cell of the set of memory cells;
    detecting an error associated with the sensed states of the set of memory cells;
    changing a voltage of a node of the electronic memory apparatus from a first value to a second value in response to the error detection;
    indicating that the error has been detected based at least in part on changing the voltage of the node; and
    changing the voltage of the node to the first value based at least in part on a deselection of the set of memory cells, wherein the deselection occurs after determining the error has been detected.

2. The method of claim 1, wherein sensing comprises:
    comparing a voltage or current from each memory cell to a reference voltage or reference current, wherein the state of each memory cell is determined based at least in part on the comparison for each respective memory cell.

3. The method of claim 1, wherein the error is a one bit error or a two bit error.

4. The method of claim 3, further comprising:
    determining that the error is a one bit error; and
    correcting the one bit error.

5. The method of claim 1, further comprising:
    configuring, responsive to a user input, a type of error to be detected, wherein the type of error comprises a one bit error or a two bit error, or both.

6. The method of claim 1, further comprising:
    storing an indication of the detected error in a storage portion of the electronic memory apparatus.

7. The method of claim 1, further comprising:
    enabling an error detection mode, wherein the error is detected based at least in part on enabling the error detection mode.

8. A method of operating an electronic memory apparatus, comprising:
    sensing a state of each cell of a set of memory cells of the electronic memory apparatus;
    detecting an error associated with the sensed states of the set of memory cells;
    changing a voltage of a node of the electronic memory apparatus from a first value to a second value in response to the error detection;
    indicating that the error has been detected based at least in part on changing the voltage of the node;
    determining that a threshold amount of time has elapsed since determining that the error has been detected; and
    changing the voltage of the node to the first value based at least in part on the determination that the threshold amount of time has elapsed.

9. The method of claim 8, wherein sensing comprises:
    comparing a voltage or current from each memory cell to a reference voltage or reference current, wherein the state of each memory cell is determined based at least in part on the comparison for each respective memory cell.

10. The method of claim 8, wherein the error is a one bit error or a two bit error.

11. The method of claim 10, further comprising:
    determining that the error is a one bit error; and
    correcting the one bit error.

12. The method of claim 8, further comprising:
    configuring, responsive to a user input, a type of error to be detected, wherein the type of error comprises a one bit error or a two bit error, or both.

13. The method of claim 8, further comprising:
    storing an indication of the detected error in a storage portion of the electronic memory apparatus.

14. The method of claim 8, further comprising:
    enabling an error detection mode, wherein the error is detected based at least in part on enabling the error detection mode.

15. A method of operating an electronic memory apparatus, comprising:
    sensing a state of each cell of a set of memory cells of the electronic memory apparatus;
    detecting an error associated with the sensed states of the set of memory cells;
    changing a voltage of a node of the electronic memory apparatus from a first value to a second value in response to the error detection;
    indicating that the error has been detected based at least in part on changing the voltage of the node;
    detecting another error associated with a different set of memory cells; and
    maintaining the voltage of the node at the second value irrespective of the detection of the other error.

16. The method of claim 15, wherein sensing comprises:
    comparing a voltage or current from each memory cell to a reference voltage or reference current, wherein the state of each memory cell is determined based at least in part on the comparison for each respective memory cell.

17. The method of claim 15, wherein the error is a one bit error or a two bit error.

18. The method of claim 17, further comprising:
determining that the error is a one bit error; and
correcting the one bit error.

19. The method of claim 15, further comprising:
configuring, responsive to a user input, a type of error to be detected, wherein the type of error comprises a one bit error or a two bit error, or both.

20. The method of claim 15, further comprising:
storing an indication of the detected error in a storage portion of the electronic memory apparatus.

21. The method of claim 15, further comprising:
enabling an error detection mode, wherein the error is detected based at least in part on enabling the error detection mode.

22. An electronic memory apparatus comprising:
a memory array; and
a memory controller configured to:
select a set of memory cells of the memory array for sensing;
sense a state of each cell of the set of memory cells;
detect an error associated with the sensed states of the set of memory cells;
change a voltage of a node of the electronic memory apparatus from a first value to a second value in response to the error detection;
indicate that the error has been detected based at least in part on changing the voltage of the node; and
change the voltage of the node to the first value based at least in part on a deselection of the set of memory cells, wherein the deselection occurs after determining the error has been detected, or based at least in part on a determination that a threshold amount of time has elapsed since determining that the error has been detected.

* * * * *